(12) United States Patent
Hatano et al.

(10) Patent No.: US 8,487,515 B2
(45) Date of Patent: *Jul. 16, 2013

(54) PIEZOELECTRIC CERAMIC, PROCESS FOR PRODUCING THE PIEZOELECTRIC CERAMIC, AND PIEZOELECTRIC DEVICE

(75) Inventors: Keiichi Hatano, Takasaki (JP); Sumiaki Kishimoto, Takasaki (JP); Yutaka Doshida, Takasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 276 days.

This patent is subject to a terminal disclaimer.

(21) Appl. No.: 13/060,253

(22) PCT Filed: Aug. 10, 2009

(86) PCT No.: PCT/JP2009/064371
§ 371 (c)(1),
(2), (4) Date: Feb. 22, 2011

(87) PCT Pub. No.: WO2010/024140
PCT Pub. Date: Mar. 4, 2010

(65) Prior Publication Data
US 2011/0156540 A1 Jun. 30, 2011

(30) Foreign Application Priority Data

Aug. 29, 2008 (JP) ................. 2008-221490

(51) Int. Cl.
*H01L 41/187* (2006.01)
(52) U.S. Cl.
CPC .................. *H01L 41/1873* (2013.01)
USPC ....................................... 310/358

(58) Field of Classification Search
CPC ......... H01L 41/16; H01L 41/18; H01L 41/183; H01L 41/187; H01L 41/1871; H01L 41/1873; H01L 41/1875; H01L 41/1876; H01L 41/1878
USPC ......................................... 310/358
See application file for complete search history.

(56) References Cited

U.S. PATENT DOCUMENTS
2012/0161588 A1 6/2012 Hatano et al.

FOREIGN PATENT DOCUMENTS

| JP | 2001-130961 A | 5/2001 |
| JP | 2002-241175 A | 8/2002 |
| JP | 2003-201172 A | 7/2003 |
| JP | 2004-075448 A | 3/2004 |
| JP | 2004-075449 A | 3/2004 |
| JP | 2004-161532 A | 6/2004 |
| JP | 2004-244301 A | 9/2004 |
| JP | 2004-323325 A | 11/2004 |

(Continued)

OTHER PUBLICATIONS

Hirofumi Takahashi, Yoshiki Numamoto, Junji Tani, Kazuya Matsuta, Jinhao Qiu, Sadahiro Tsurekawa / Lead-Free Barium Titanate Ceramics with Large Piezoelectric Constant Fabricated by Microwave Sintering / Japanese Journal of Applied Physics vol. 45, No. 1, 2006, pp. L30 to L32 (Dec. 28, 2005).

(Continued)

*Primary Examiner* — Derek Rosenau
(74) *Attorney, Agent, or Firm* — Law Office of Katsuhiro Arai

(57) ABSTRACT

As a piezoelectric ceramic having an alkaline-containing niobic acid-perovskite structure contains $[K_{1-x}Na_x]_{1-y}Li[Nb_{1-z-w}Ta_zSb_w]O_3$ (x, y, z, and w each indicate a molar ratio, and $0 \leq x<1$, $0 \leq y<1$, $0 \leq z<1$, and $0 \leq w<1$ hold) as a primary phase and $K_3Nb_3O_6Si_2O_7$ as a subphase.

9 Claims, 2 Drawing Sheets

FOREIGN PATENT DOCUMENTS

| | | |
|---|---|---|
| JP | 2006-056778 A | 3/2006 |
| JP | 2006-062955 A | 3/2006 |
| JP | 2006-143588 A | 6/2006 |
| JP | 2007-204336 A | 8/2007 |
| JP | 2007-324538 A | 12/2007 |
| JP | 4044943 B | 2/2008 |
| JP | 4044944 B | 2/2008 |
| JP | 2008-050206 A | 3/2008 |
| WO | 2010/128647 A1 | 11/2010 |

OTHER PUBLICATIONS

Tomoaki Karaki, Kang Yan, Toshiyuki Miyamoto, Masatoshi Adachi / Lead-Free Piezoelectric Ceramics with Large Dielectric and Piezoelectric Constants Manufactured from BaTiO3 Nano-Powder/ Japanese Journal of Applied Physics vol. 46, No. 4, 2007, pp. L97 to L98 (Jan. 19, 2007).

PIEZOELECTRIC CERAMIC, PROCESS FOR PRODUCING THE PIEZOELECTRIC CERAMIC, AND PIEZOELECTRIC DEVICE

This application is the U.S. National Phase under 35 U.S.C. §371 of International Application PCT/JP2009/064371, filed Aug. 10, 2009, which claims priority to Japanese Patent Application No. 2008-221490, filed Aug. 29, 2008. The International Application was published under PCT Article 21(2) in a language other than English.

TECHNICAL FIELD

The present invention relates to a piezoelectric ceramic, in particular, to a piezoelectric ceramic which contains no lead and which has an alkali-containing niobic acid-perovskite structure, a method for manufacturing the piezoelectric ceramic, and a piezoelectric ceramic component (piezoelectric device), such as a piezoelectric sounding body, a piezoelectric sensor, a piezoelectric actuator, a piezoelectric transformer, or a piezoelectric ultrasonic wave motor, using the piezoelectric ceramic.

BACKGROUND ART

By using a principle, that is, a piezoelectric effect, of a piezoelectric ceramic (hereinafter, also referred to as "piezoelectric ceramic composition" in some cases) in which electrical energy is converted into mechanical energy or mechanical energy is converted into electrical energy, piezoelectric ceramics have been used for many electronic devices.

Heretofore, in a piezoelectric device including a piezoelectric ceramic, for example, there are used a lead-containing piezoelectric ceramic composition composed of two components represented by $PbTiO_3$—$PbZrO_3$ (hereafter referred to as "PZT") and PZT containing as a third component a lead-containing composite perovskite composition represented by $Pb(Mg_{1/3}Nb_{2/3})O_3$, $Pb(Zn_{1/3}Nb_{2/3})O_3$, or the like.

These lead-containing piezoelectric-ceramic compositions containing PZT as a primary component have high piezoelectric properties and are used for most electronic devices using the piezoelectric effect which are now in practical use.

However, since lead is contained in the primary component, high environmental burdens, such as volatilization of PbO in manufacturing, have caused problems.

Accordingly, a piezoelectric ceramic composition containing no lead or a small amount of lead has been desired.

In recent years, research and development has been energetically carried out, and as piezoelectric ceramic compositions containing no lead, for example, there may be mentioned a composition having a perovskite structure composed of $BaTiO_3$ (Non-Patent Documents 1 and 2), a composition having a Bi-containing perovskite structure composed of two components represented by $(Bi_{1/2}Na_{1/2})TiO_3$—$(Bi_{1/2}K_{1/2})TiO_3$ (Patent Documents 1 to 4), a composition having a tungsten bronze structure which contains (Ba, Sr, $Ca)_2NaNb_5O_{15}$ as a primary component (Patent Documents 5 to 7), a composition having a bismuth layer structure which contains $SrBi_2Nb_2O_9$ as a primary component (Patent Documents 8 to 10), and a composition having an alkali-containing niobic acid-perovskite structure which contains $KNbO_2$—$NaNbO_2$—$LiNbO_2$ (Patent Documents 11 to 13) as a primary component.

Non-Patent Document 1: Japanese Journal of Applied Physics Vol. 45, No. 1, 2006, pp. L30 to L32
Non-Patent Document 2: Japanese Journal of Applied Physics Vol. 46, No. 4, 2007, pp. L97 to 98
Patent Document 1: Japanese Unexamined Patent Application Publication No. 2003-201172
Patent Document 2: Japanese Unexamined Patent Application Publication No. 2004-75449
Patent Document 3: Japanese Patent No. 4044943
Patent Document 4: Japanese Patent No. 4044944
Patent Document 5: Japanese Unexamined Patent Application Publication No. 2004-75448
Patent Document 6: Japanese Unexamined Patent Application Publication No. 2004-161532
Patent Document 7: Japanese Unexamined Patent Application Publication No. 2006-143588
Patent Document 8: Japanese Unexamined Patent Application Publication No. 2001-130961
Patent Document 9: Japanese Unexamined Patent Application Publication No. 2002-241175
Patent Document 10: Japanese Unexamined Patent Application Publication No. 2006-62955
Patent Document 11: Japanese Unexamined Patent Application Publication No. 2006-56778
Patent Document 12: Japanese Unexamined Patent Application Publication No. 2007-204336
Patent Document 13: Japanese Unexamined Patent Application Publication No. 2004-244301

Among the above compositions, the compositions described in Non-Patent Documents 1 and 2 are each a piezoelectric ceramic composition that uses $BaTiO_3$, which has been used in large amounts for ceramic capacitors and the like and to which it is believed that existing techniques are easily applied, which exhibits high piezoelectric properties, and which has a homogeneous polycrystalline structure. However, since the Curie temperature of $BaTiO_3$ is approximately 125° C., as the limit by this physical property, the piezoelectric effect disappears in a temperature range of 125° C. or more, and hence the above composition is not appropriately applied to a piezoelectric device used, for example, in a vehicle, which is required to work in a wide temperature range of −50° C. to 150° C.

In addition, in the compositions described in Patent Documents 1 to 4, a temperature at which the composition becomes an antiferroelectric crystal and loses its piezoelectric effect is in a range of 100° C. to 200° C., and hence, these compositions are also not appropriately used for operation in a high temperature range of 100° C. or more.

In addition, since having a Curie temperature of approximately 300° C., the compositions described in Patent Documents 5 to 7 each exhibit the piezoelectric effect in a wide temperature range of −50° C. to 150° C.

However, in the composition described in Patent Document 5, the electromechanical coupling coefficient (kr), which is the index of the piezoelectric properties, of a disc element in the diameter direction is as low as 12.5% at the maximum.

Furthermore, in the compositions described in Patent Documents 6 and 7, the polycrystalline structures thereof each have an average diameter of 3 to 20 μm, and hence, for application to recent piezoelectric devices which are required to have a smaller size, a smaller layer thickness, and smaller film thickness, the compositions described above are required to have a more homogeneous polycrystalline structure.

In addition, because they have low piezoelectric properties, the compositions described in Patent Documents 8 to 10 are also not appropriately used as a substitute for PZT.

In addition, since the compositions described in Patent Documents 11 to 13 which are similar to the composition of the present invention are able to have a high Curie temperature of 250° C. or more and to have a piezoelectric displacement characteristic ($-d_{31}$) of 100 or more in a horizontal direction along a polarization direction when the composition is appropriately selected, it is well known that the compositions described above have excellent properties as a piezoelectric ceramic composition containing no lead.

However, as described in Patent Document 12, the polycrystalline structure of the piezoelectric composition contains large grains having a grain diameter of up to 20 μm, and hence, for application to recent piezoelectric devices which are required to have a smaller size, a smaller layer thickness, and a smaller film thickness, the use of the composition described above is inherently limited to a certain degree as described above.

In addition, although the compositions described in Patent Documents 11 and 13 each attempted to improve its sintering properties and piezoelectric properties by addition of $SiO_2$ to its main composition, a $K_3Nb_3O_6Si_2O_7$ crystalline phase has not been disclosed. Unlike the composition of the present invention [in paragraph [0136] of Patent Document 13, it has only been suggested that $SiO_2$ used as an additive is partly contained in grain boundaries of each piezoelectric ceramic composition as an oxide or a compound, such as a perovskite structure compound and is partly contained so that a Si atom substitutes for at least part of Nb, Ta, and Sb of a compound represented by $\{Li_{0.04}(K_{0.5}Na_{0.5})_{0.96}\}$ $(Nb_{0.86}Ta_{0.1}Sb_{0.04})O_3$]. Furthermore, the polycrystalline structure of the composition has also not been disclosed; hence, the present invention is a completely novel invention.

As for a piezoelectric composition represented by a general formula $[Na_{1-x}K_x]_{1-y}Li_y[Nb_{1-z-w}Ta_zSb_w]O_3$ which is well known as a piezoelectric ceramic composition having an alkali-containing niobic acid-perovskite structure and containing no lead, by a conventional method, a polycrystalline structure which has a crystal having a maximum grain diameter of 10 μm or more is inevitably formed.

On the other hand, in order to suppress the precipitation of a crystal having a size of 10 μm or more, improvements by specific methods, such as a decrease in firing temperature by HIP (Non-Patent Document 3), firing in a $K_2O$ atmosphere (Patent Document 14), significantly precise control of a firing speed and a firing temperature (Non-Patent Document 4) have been attempted; however, there has been a limit.

Non-Patent Document 3: Journal of American Ceramics Society Vol. 45, No. 5, 209-213 (1962)
Non-Patent Document 4: Materials Science and Engineering B 131 83-87 (2006)
Patent Document 14: Japanese Unexamined Patent Application Publication No. 2004-359539

DISCLOSURE OF INVENTION

Problems to be Solved by the Invention

When a technique is realized in which the polycrystalline structure is made fine and in which the grain growth of each crystal is suppressed, for example, the reliability of a ceramic electronic device having a multilayer structure and a smaller film thickness can be improved, and in order to form a practically usable piezoelectric device which contains no lead and which uses a piezoelectric ceramic having an alkali-containing niobic acid-perovskite structure as a piezoelectric layer, the technique described above is significantly important.

An object of the present invention is to provide a piezoelectric ceramic containing no lead, in particular, a piezoelectric ceramic having high piezoelectric properties and an alkali-containing niobic acid-perovskite structure, which is dense and which has a fine and homogeneous internal polycrystalline structure without performing firing under high pressure, firing in a specific atmosphere, and precise control of firing conditions, and also to provide a method for manufacturing the piezoelectric ceramic described above and a piezoelectric device using the piezoelectric ceramic.

Means for Solving the Problems

In order to establish a technique that decreases the grain diameter of a polycrystalline structure of a ceramic composition to be obtained and that easily densifies the ceramic composition by a general firing method without performing atmosphere control and pressure control, the present invention aims to control the polycrystalline structure by generating a second phase in the composition.

After many compositions were investigated, it was found that by introducing a composition represented by $K_3Nb_3O_6Si_2O_7$ into a piezoelectric ceramic composition, the piezoelectric properties thereof are further improved, and by the control of a polycrystalline structure of the piezoelectric composition using a general firing method, the polycrystalline structure can easily be made fine.

In the present invention, the following measures are taken in order to achieve the above object.

(1) A piezoelectric ceramic is characterized by including: $[K_{1-x}Na_x]_{1-y}Li_y[Nb_{1-z-w}Ta_zSb_w]O_3$ (x, y, z, and w each indicate a molar ratio, and $0 \leq x < 1$, $0 \leq y < 1$, $0 \leq z < 1$, and $0 \leq w < 1$ hold) as a primary phase and $K_3Nb_3O_6Si_2O_7$ as a subphase.

(2) The piezoelectric ceramic according to the above (1) is characterized in that when expressed as $(1-a)[K_{1-x}Na_x]_{1-y}Li_y[Nb_{1-z-w}Ta_zSb_w]O_3+aK_3Nb_3O_6Si_2O_7$ (a indicates a molar ratio), $0.003 \leq a \leq 0.10$ holds.

(3) The piezoelectric ceramic according to the above (1) or (2) is characterized in that as analyzed by an X-ray diffraction method, the ratio $I_2/I_1$ of a peak intensity $I_2$ of the strongest peak corresponding to a crystalline phase of the $K_3Nb_3O_6Si_2O_7$ to a peak intensity $I_1$ of the strongest peak corresponding to a crystalline phase of the $[K_{1-x}Na_x]_{1-y}Li_y[Nb_{1-z-w}Ta_zSb_w]O_3$ is 0.8% to 9.0%.

(4) A piezoelectric device is characterized in that a piezoelectric ceramic layer, via which a first electrode and a second electrode face each other, is formed of the piezoelectric ceramic according to one of the above (1) and (2).

(5) The piezoelectric device according to the above (4) is characterized in that the first electrode and the second electrode are multiply and alternately stacked with the piezoelectric ceramic layer interposed between each electrode, and first terminal electrodes electrically connected to the first electrodes and second terminal electrodes electrically connected to the second electrodes are further provided.

(6) A method for manufacturing a piezoelectric ceramic is characterized by including: a step of obtaining a perovskite composition represented by $[K_{1-x}Na_x]_{1-y}Li_y[Nb_{1-z-w}Ta_zSb_w]O_3$ (x, y, z, and w each indicate a molar ratio, and $0 \leq x < 1$, $0 \leq y < 1$, $0 \leq z < 1$, and $0 \leq w < 1$ hold); a step of obtaining a composition represented by $K_3Nb_3O_6Si_2O_7$; a step of mixing the $[K_{1-x}Na_x]_{1-y}Li_y[Nb_{1-z-w}Ta_zSb_w]O_3$ and the $K_3Nb_3O_6Si_2O_7$; and a step of and firing a mixture thereof.

(7) A method for manufacturing a piezoelectric ceramic is characterized by including: a step of obtaining a composition represented by $K_3Nb_3O_6Si_2O_7$; a step of blending a material containing potassium, a material containing sodium, a material containing lithium, a material containing niobium, a material containing tantalum, and a material containing antimony to form a perovskite composition represented by $[K_{1-x}Na_x]_{1-y}Li_y[Nb_{1-z-w}Ta_zSb_w]O_3$ (x, y, z, and w each indicate a molar ratio, and $0 \leq x < 1$, $0 \leq y < 1$, $0 \leq z < 1$, and $0 \leq w < 1$ hold)

and mixing this composition with the $K_3Nb_3O_6Si_2O_7$; and a step of calcining, molding, and firing a mixture thereof.

(8) The method for manufacturing a piezoelectric ceramic according to the above (6) or (7) is characterized in that when the ratio between the $[K_{1-x}Na_x]_{1-y}Li_y[Nb_{1-z-w}Ta_zSb_w]O_3$ and the $K_3Nb_3O_6Si_2O_7$ is represented by (1-a) $[K_{1-x}Na_x]_{1-y}Li_y[Nb_{1-z-w}Ta_zSb_w]O_3+aK_3Nb_3O_6Si_2O_7$ (a indicates a molar ratio), the mixing is performed so that $0.003 \leq a \leq 0.10$ holds.

Advantageous Effect of the Invention

Since the piezoelectric ceramic of the present invention is densified, and the internal polycrystalline structure thereof is made fine and homogeneous, this piezoelectric material has more excellent properties as a whole without considerably decreasing its piezoelectric displacement characteristic $(-d_{31})$, electromechanical coupling coefficient (kr), relative dielectric constant ($\in$) and resistivity ($\rho$) and without increasing the dielectric dispersion (tan $\delta$).

Furthermore, when the internal polycrystalline structure is made fine and homogeneous, for example, in the case in which the piezoelectric ceramic of the present invention is used for a piezoelectric device having a multilayer structure, a multilayer structure including many laminated layers can be significantly advantageously formed, the distance between the laminated layers can be further decreased, the number of the laminated layers per unit distance can be increased, and a voltage required for obtaining a predetermined electric field strength can be decreased, so that a low power consumption and a large displacement amount can be obtained.

BEST MODES FOR CARRYING OUT THE INVENTION

Figure 1:
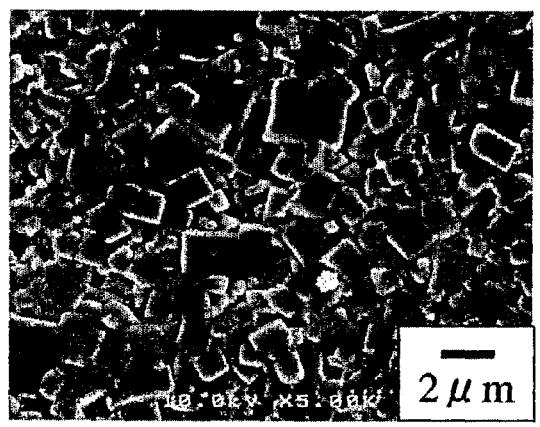
FIG. 1 is a photograph of an observed surface of $0.97K_{0.5}Na_{0.5}NbO_3-0.03K_3Nb_3O_6Si_2O_7$ (Experiment No. 5) taken by a SEM.

A piezoelectric ceramic which has an alkali-containing niobic acid-perovskite structure of the present invention includes $[K_{1-x}Na_x]_{1-y}Li_y[Nb_{1-z-w}Ta_zSb_w]O_3$ (x, y, z, and w each indicate a molar ratio, and $0 \leq x < 1$, $0 \leq y < 1$, $0 \leq z < 1$, and $0 \leq w < 1$ hold) as a primary phase and $K_3Nb_3O_6Si_2O_7$ as a subphase.

Since $K_3Nb_3O_6Si_2O_7$ is included as the subphase, an effect in which an internal polycrystalline structure is made fine and homogeneous is obtained. In addition, this effect is obtained regardless of the values of x, y, z, and w.

In addition, when the piezoelectric ceramic is represented by (1-a) $[K_{1-x}Na_x]_{1-y}Li_y[Nb_{1-z-w}Ta_zSb_w]O_3+aK_3Nb_3O_6Si_2O_7$ (a indicates a molar ratio), it is preferable that $0.003 \leq a 0.10$ holds, and it is more preferable that $0.006 \leq a 0.08$ holds.

The significant change in fine structure can be shown when $a \geq 0.003$ holds. However, in the case in which $a > 0.10$ holds, since $K_3Nb_3O_6Si_2O_7$ itself has no piezoelectric effect, when a large amount thereof is precipitated, the piezoelectric properties are degraded as compared to those in the case in which no $K_3Nb_3O_6Si_2O_7$ is contained, and although a sintered polycrystalline structure can be made finer, it is difficult to obtain an excellent piezoelectric displacement characteristic.

The piezoelectric ceramic of the present invention is preferably in a range represented by the formula (1-a)($[K_{1-x}Na_x]_{1-y}Li_y$) $(Nb_{1-z-w}Ta_zSb_w)O_3+aK_3Nb_3O_6Si_2O_7$ (where x, y, z, and w satisfy $0 \leq x < 1.0$, $0 \leq y \leq 0.20$, $0 \leq z \leq 0.40$, $0 \leq w \leq 0.20$, and $0.003 \leq a \leq 0.10$ holds). When the above ranges are satisfied, a piezoelectric ceramic can be obtained which has an excellent piezoelectric displacement characteristic, a Curie temperature of 150° C. or more, and a sufficient resistivity.

The piezoelectric ceramic of the present invention is more preferably in a range represented by the formula (1-a) ($[K_{1-x}Na_x]_{1-y}Li_y$) $(Nb_{1-z-w}Ta_zSb_w)O_3+aK_3Nb_3O_6Si_2O_7$ (where x, y, z, and w satisfy $0 \leq x < 1.0$, $0 \leq y \leq 0.15$, $0 \leq z \leq 0.20$, $0 \leq w \leq 0.10$, and $0.006 \leq a \leq 0.08$ holds).

When the piezoelectric ceramic is in the ranges described above, a high Curie temperature of 200° C. or more is obtained; the piezoelectric effect is prevented from being lost at a high temperature; a practical relative dielectric constant ($\in$), a low dielectric dispersion (tan $\delta$), a high electromechanical coupling coefficient (kr), and a high piezoelectric displacement characteristic $(-d_{31})$ can be obtained; and its polycrystalline structure is also homogeneous.

In addition, in the piezoelectric ceramic of the present invention, although it is possible that by addition of a predetermined amount of at least one of Sc, Ti, V, Cr, Mn, Fe, Co, Ni, Cu, and Zn, each of which is a first transition element, the sintering temperature is controlled, the growth of grains is controlled, and the life is extended in a high electric field, these elements may or may not be used.

In addition, in the piezoelectric ceramic of the present invention, although it is possible that by addition of a predetermined amount of at least one of Y, Zr, Mo, Ru, Rh, Pd, and Ag, each of which is a second transition element, the sintering temperature is controlled, the growth of grains is controlled, and the life is extended in a high electric field, these elements may or may not be used.

In addition, in the piezoelectric ceramic of the present invention, although it is possible that by addition of a predetermined amount of at least one of La, Ce, Pr, Nd, Sm, Eu, Gd, Tb, Dy, Ho, Er, Tm, Yb, Lu, Hf, W, Re, Os, Ir, Pt, and Au, each of which is a third transition element, the sintering temperature is controlled, the growth of grains is controlled, and the life is extended in a high electric field, these elements may or may not be used.

Furthermore, although it is possible that by addition of a predetermined amount of at least one of the first, the second, and the third transition elements mentioned above, the sintering temperature is controlled, the growth of grains is controlled, and the life is extended in a high electric field, an effect similar to that described above can be obtained regardless of whether the above elements are used alone or in combination.

In the present invention, as a method for manufacturing a piezoelectric ceramic, a method may be used which includes a step of obtaining a perovskite composition represented by $[K_{1-x}Na_x]_{1-y}Li_y[Nb_{1-z-w}Ta_zSb_w]O_3$ (x, y, z, and w each indicate a molar ratio, and $0 \leq x < 1$, $0 \leq y < 1$, $0 \leq z < 1$, and $0 \leq w < 1$ hold); a step of obtaining a composition represented by $K_3Nb_3O_6Si_2O_7$; a step of mixing the $[K_{1-x}Na_x]_{1-y}Li_y[Nb_{1-z-w}Ta_zSb_w]O_3$ and the $K_3Nb_3O_6Si_2O_7$; and a step of molding and firing a mixture therebetween.

In addition, a method is used which includes a step of obtaining a composition represented by $K_3Nb_3O_6Si_2O_7$; a step of blending a material containing potassium, a material containing sodium, a material containing lithium, a material containing niobium, a material containing tantalum, and a material containing antimony to form a perovskite composition represented by $[K_{1-x}Na_x]_{1-y}Li_y[Nb_{1-z-w}Ta_zSb_w]O_3$ (x, y, z, and w each indicate a molar ratio, and $0 \leq x<1$, $0 \leq y<1$, $0 \leq z<1$, and $0 \leq w<1$ hold) and mixing this composition with the $K_3Nb_3O_6Si_2O_7$; and a step of calcining, molding, and firing a mixture therebetween.

In this case, as raw materials (materials) realizing the manufacturing method of the present invention, it is preferable that $K_2CO_3$ or $KHCO_3$ is used as the material containing potassium, $Na_2CO_3$ or $NaHCO_3$ is used as the material containing sodium, $Li_2CO_3$ is used as the material containing lithium, $Nb_2O_5$ is preferably used as the material containing niobium, $Ta_2O_5$ is used as the material containing tantalum, $Sb_2O_3$ or $Sb_2O_5$ is used as the material containing antimony, and $SiO_2$ is used as a material containing silicon for obtaining $K_3Nb_3O_6Si_2O_7$. By using the raw materials described above, the steps of blending, stirring, calcination, and the like can easily be performed, and hence, synthesis can be performed without imposing any burdens on the manufacturing.

In the present invention, calcination is preferably performed at 700° C. to 1,000° C., various binders, such as polyvinyl alcohol and polyvinyl butyral, which are generally used may be used as a binder for forming a powder, and firing is preferably performed at 1,040° C. to 1,180° C.

The piezoelectric ceramic of the present invention has a perovskite structure generally represented by $ABO_3$. In this structure, the element located at the A-site is at least one of K, Na, an Li, and the element located at the B-site is at least one of Nb, Ta, and Sb. When the stoichiometry is set so that A:B=1:1 holds, the elements are ideally and completely located at all the site positions, so that a stable structure is obtained. However, as is apparent from the constituent elements of the composition, the composition finally changes by approximately several percent, in particular, by 2% or less due to elution of K, Na, and Li by moisture, volatilization of K, Na, and Li in a calcination step, volatilization of K, Na, and Li in a firing step, and the like. The changes of these constituent elements may occur by the changes of the raw materials, synthesis timing, and synthesis process.

In order to suppress these changes, for example, a technique is used in which the amounts of raw materials used as Na, Li, and Sb sources are intentionally increased in initial blending, and in a final step, that is, in the firing step or a step thereafter, the composition is made close to an ideal state in which A:B=1:1 holds.

In order to obtain a ceramic having a high piezoelectric effect, a final ratio of the A-site to the B-site is preferably set so as to satisfy 0.96<A/B<1.002.

The appropriate adjustment of the amounts of elements which is intentionally performed in the initial blending as described above is a general technique performed in almost all syntheses of ceramics.

In the piezoelectric ceramic obtained by the present invention, the relative density of a sintered body is preferably 95% or more.

Furthermore, in a diffraction pattern which is obtained by x-rays from a powder prepared by pulverizing the sintered body, the ratio of a line intensity of the strongest line of a silicon-containing phase represented by $K_3Nb_3O_6Si_2O_7$ to a line intensity of the strongest line of a perovskite compound phase which is a phase exhibiting the piezoelectric effect is preferably 0.3% to 9.0%. Although the composition of the present invention is a piezoelectric ceramic characterized in that $K_3Nb_3O_6Si_2O_7$ is precipitated, when the precipitation amount is too small, the polycrystalline structure is not made fine and homogeneous thereby, and when the precipitation amount is large, since the silicon-containing $K_3Nb_3O_6Si_2O_7$ phase exhibits no piezoelectric effect, the piezoelectric properties are degraded as described above.

Hereafter, with reference to examples, the method for manufacturing a piezoelectric ceramic of the present invention and evaluation results will be described.

EXAMPLE 1

In order to evaluate a polycrystalline structure and piezoelectric properties of a piezoelectric ceramic represented by $(1-a)K_{0.5}Na_{0.5}NbO_3+aK_3Nb_3O_6Si_2O_7$, (where, a=0, 0.003, 0.006, 0.01, 0.03, 0.06, 0.08, 0.1, and 0.12, and corresponding to Experiment Nos. 1 to 9, respectively, in this order), the following experiments were carried out.

The piezoelectric ceramic of Experiment No. 1 is out of the range of the present invention and is a comparative example. The piezoelectric ceramics of Experiment Nos. 2 to 9 are each within the range of the present invention, and the piezoelectric ceramics of Experiment Nos. 2 to 8 are within the range of a composition formula (1-a) $([K_{1-x}Na_x]_{1-y}Li_y)(Nb_{1-z-w}Ta_zSb_w)O_3+aK_3Nb_3O_6Si_2O_7$ (where x, y, z, and w satisfy $0 \leq x<1.0$, $0 \leq y<1$, $0 \leq z<1$, $0 \leq w<1$, and $0.003 \leq a \leq 0.10$ holds).

As raw materials for the piezoelectric ceramic, $K_2CO_3$ (or $KHCO_3$), $Na_2CO_3$ (or $NaHCO_3$), $Nb_2O_5$, $Ta_2O_5$, $Sb_2O_3$ (or $Sb_2O_5$), and $K_3Nb_3O_6Si_2O_7$, each having a purity of 99% or more, were prepared and were blended to form a composition which satisfied the chemical stoichiometry shown in Example 1 described above.

The raw materials thus blended were mixed together in ethanol by a ball mill for 24 hours, and ethanol was then vaporized in a dryer at a temperature of 100° C., thereby obtaining a target raw material mixture. Next, after this raw material mixture was calcined at 950° C. for 3 hours, pulverization thereof was performed in ethanol for 24 hours by a ball mill. Subsequently, polyvinyl alcohol was added as a binder, and pelletization was performed.

After the pelletized powder was pressure molded into a disc having a thickness of 0.6 mm and a diameter of 10 mm, a molded body was fired at 1,080° C. to 1,130° C. for 2 hours at ordinary pressure in an air atmosphere.

At this stage, it was confirmed that all the samples of Experiment No. 1 to 9 were sufficiently densified.

After Ag electrodes were formed by screen-printing on two surfaces of the disc sample thus obtained and were fired at 800° C., an electric field of 3 kV/mm was applied for 15 minutes in an oil bath at 150° C., so that a polarization treatment was performed.

Subsequently, the disc thus treated was allowed to stand still over one night, the dielectric constant ($\in$), the dielectric dispersion (tan δ), the resistivity (ρ [Ω·cm]), the electromechanical coupling coefficient (kr) in a disc diameter direction, and the piezoelectric displacement characteristic ($-d_{31}$ [pm/V]) of the disc sample of each of Experiment Nos. 1 to 9 were measured by using a resonance-antiresonance method.

In addition, in order to observe the polycrystalline structure of the sintered body, a scanning electron microscope (SEM) was used. In order to evaluate the grain diameter, in accordance with a photographic method, an arbitrary number of horizontal lines were drawn on a photograph obtained thereby, and the average length and the maximum length of each of grains intersected by the lines were obtained by an imaging apparatus. Hereinafter, the values thus obtained are regarded as the average grain diameter and the maximum grain diameter. The number of measured grains was set to approximately 400 or more.

In addition, in order to identify the crystalline phase which precipitated in the obtained polycrystalline, a diffraction pattern by an X-ray diffraction method (hereinafter, abbreviated as XRD) was obtained. The line source used in this case was Cu-Kα rays, 2θ/θ scan was performed using a focused optical system, and a diffraction line pattern in a range of $20° \leq 2\theta \leq 60°$ was obtained. In Experiment Nos. 2 to 9, as a fixed phase, a phase having an alkali-containing niobic acid-perovskite structure was confirmed as a primary phase, and precipitation of $K_3Nb_3O_6Si_2O_7$ as disclosed in the following Reference Document 1 was confirmed as a subphase (secondary phase).

In addition, the line strength of the strongest line of the primary phase and the line strength of the strongest line of the secondary phase were evaluated, and the precipitation amount of $K_3Nb_3O_6Si_2O_7$ was estimated by the ratio therebetween. That is, the evaluation was performed based on $I_2/I_1$=<precipitation amount of $K_3Nb_3O_6Si_2O_7$>=<Line intensity of the strongest line of $K_3Nb_3O_6Si_2O_7$>/<line intensity of the strongest line of the primary phase>. The individual values thus obtained are collectively shown in Table 1. In addition, the measurement by XRD was performed using RINT-2500/PC manufactured by Rigaku Corp.

Reference Document 1: Powder Diffraction 9(2) 96-97 (1994)

Figure 2:
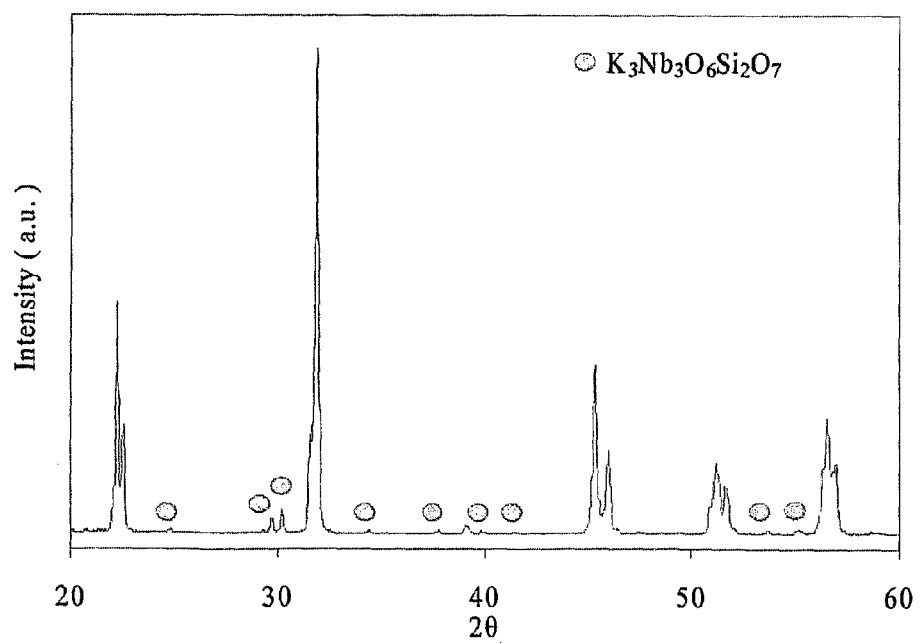
FIG. 2 is a view showing an x-ray diffraction pattern of $0.97K_{0.5}Na_{0.5}NbO_3-0.03K_3Nb_3O_6Si_2O_7$ (Experiment No. 6).

In addition, in Experiment Nos. 2 to 8, $I_2/I_1$ was in a range of 0.9% to 8.6%. The diffraction pattern by XRD in Experiment No. 6 is shown in FIG. 2.

Subsequently, the optimal composition ratio of $K_3Nb_3O_6Si_2O_7$ was set to 0.03, that is, 0.97 $([K_{1-x}Na_x]_{1-y}Li_y)(Nb_{1-z-w}Ta_zSb_w)O_3 + 0.03K_3Nb_3O_6Si_2O_7$ was used, and hereinafter, as Example 2, piezoelectric ceramics having various alkali-containing niobic acid-perovskite structures were evaluated in a manner similar to that described above.

EXAMPLE 2

The compositions of the piezoelectric ceramics used in Example 2 were as follows.

Experiment No. 10: $x=0.50$, $y=0$, $z=0.20$, and $w=0$ were satisfied. That is, a piezoelectric ceramic represented by 0.97 $[K_{0.5}Na_{0.5}]Nb_{0.80}Ta_{0.20}O_3 + 0.03K_3Nb_3O_6Si_2O_7$ was evaluated.

Experiment No. 11: $x=0.50$, $y=0.03$, $z=0.20$, and $w=0$ were satisfied. That is, a piezoelectric ceramic represented by 0.97 $[K_{0.5}Na_{0.5}]_{0.97}Li_{0.03}Nb_{0.80}Ta_{0.20}O_3 + 0.03K_3Nb_3O_6Si_2O_7$ was evaluated.

Experiment No. 12: $x=0.50$, $y=0.04$, $z=0.10$, and $w=0.04$ were satisfied. That is, a piezoelectric ceramic represented by

TABLE 1

| | ※1 | 2 | 3 | 4 | 5 | 6 | 7 | 8 | 9 |
|---|---|---|---|---|---|---|---|---|---|
| a | 0 | 0.003 | 0.006 | 0.01 | 0.03 | 0.06 | 0.08 | 0.1 | 0.12 |
| ε | 440 | 450 | 460 | 470 | 500 | 580 | 580 | 560 | 480 |
| tan δ | 0.074 | 0.045 | 0.028 | 0.024 | 0.025 | 0.028 | 0.036 | 0.044 | 0.061 |
| ρ (Ω·cm) | 1.40E+10 | 1.80E+10 | 9.00E+10 | 2.70E+11 | 6.50E+11 | 5.50E+10 | 1.60E+10 | 7.00E+09 | 3.40E+09 |
| $k_r$ | 0.33 | 0.35 | 0.38 | 0.4 | 0.39 | 0.36 | 0.35 | 0.3 | 0.24 |
| $-d_{31}$ (pm/V) | 38 | 39 | 42 | 46 | 46 | 46 | 44 | 38 | 32 |
| AVERAGE GRAIN DIAMETER (μm) | 2.8 | 2.6 | 1.9 | 1.5 | 1.2 | 0.9 | 0.9 | 0.9 | 0.8 |
| MAXIMUM GRAIN DIAMETER (μm) | 12.3 | 11.2 | 9.4 | 5.3 | 3.7 | 3.3 | 3.3 | 3.1 | 2.9 |
| $I_2/I_1$ (%) | 0.0 | 0.9 | 1.3 | 2.0 | 2.3 | 4.5 | 6.5 | 8.6 | 11.5 |

It was found that since $K_3Nb_3O_6Si_2O_7$ was contained in Experiment Nos. 2 to 9, the average grain diameter and the maximum grain diameter were decreased as compared to those of Experiment No. 1 which was a comparative example. FIG. 1 shows a photograph of an observed surface of the disc sample of Experiment No. 5 taken by a SEM.

In addition, in Experiment Nos. 2 to 7, it was found that compared to Experiment No. 1 which was a comparative example, tan δ was low, ρ was also high, and the electrical properties and the piezoelectric properties, such as kr and $-d_{31}$, relating to the reliability of a piezoelectric ceramic were improved.

In Experiment No. 8, since the substitution amount of $K_3Nb_3O_6Si_2O_7$ was increased to 0.1 mol, although a decrease in ρ was observed, the average grain diameter was decreased to less than 1 μm, the maximum grain diameter was decreased to 3.1 μm, and hence, the polycrystalline structure was further improved.

In addition, when the substitution amount of $K_3Nb_3O_6Si_2O_7$ was 0.12 mol as in Experiment No. 9, it was found that although the polycrystalline structure was further improved, ρ, kr, and $-d_{31}$ became lower than those in Experiment No. 1 which was a comparative example in which a $K_{0.5}Na_{0.5}NbO_3$ simple substance was used. Accordingly, it was found that "a" was preferably in a range of 0.003 to 0.1.

$0.97[K_{0.5}Na_{0.5}]_{0.96}Li_{0.04}Nb_{0.86}Ta_{0.10}Sb_{0.04}O_3 + 0.03K_3Nb_3O_6Si_2O_7$ was evaluated.

In addition, Experiment Nos. 13 to 15 were evaluated as comparative examples in a manner similar to that described above, and the case in which $K_3Nb_3O_6Si_2O_7$ was not introduced into the piezoelectric ceramic was also evaluated.

Experiment No. 13 (comparative example): $x=0.50$, $y=0$, $z=0.20$, and $w=0$ were satisfied. That is, a piezoelectric ceramic represented by $[K_{0.5}Na_{0.5}]Nb_{0.80}Ta_{0.20}O_3$ was evaluated for comparison.

Experiment No. 14 (comparative example): $x=0.50$, $y=0.03$, $z=0.20$, and $w=0$ were satisfied. That is, a piezoelectric ceramic represented by $[K_{0.5}Na_{0.5}]_{0.97}Li_{0.03}Nb_{0.80}Ta_{0.20}O_3$ was evaluated for comparison.

Experiment No. 15 (comparative example): $x=0.50$, $y=0.04$, $z=0.10$, and $w=0.04$ were satisfied. That is, a piezoelectric ceramic represented by $[K_{0.5}Na_{0.5}]_{0.96}Li_{0.04}Nb_{0.86}Ta_{0.10}Sb_{0.04}O_3$ was evaluated for comparison.

Also in Example 2, by the same procedure as that in Example 1, after the composition of each of Experiment Nos. 10 to 15 was blended at a stoichiometric ratio, raw materials after blending were mixed together in ethanol for 24 hours by a ball mill, and ethanol was then vaporized in a dryer at 100° C., thereby obtaining respective target raw material mixtures.

Next, after these raw material mixtures were each calcined at 950° C. for 3 hours, pulverization was performed in ethanol for 24 hours by a ball mill. Subsequently, polyvinyl alcohol was added as a binder, and pelletization was performed.

After the pelletized powder was pressure molded into a disc having a thickness of 0.6 mm and a diameter of 10 mm, a molded body was fired at 1,080° C. to 1,180° C. for 2 hours at ordinary pressure in an air atmosphere.

At this stage, it was confirmed that all the samples of Experiment Nos. 10 to 15 were sufficiently densified.

Next, as in the case of Example 1, the piezoelectric properties of each sample after the polarization treatment were evaluated, the polycrystalline structure was evaluated, and $I_2/I_1$ was evaluated. The results are shown in Table 2.

TABLE 2

|   | 10 | 11 | 12 | ⨯13 | ⨯14 | ⨯15 |
|---|---|---|---|---|---|---|
| ϵ | 830 | 1260 | 1480 | 960 | 1550 | 1730 |
| tan δ | 0.028 | 0.021 | 0.025 | 0.028 | 0.018 | 0.02 |
| ρ (Ω·cm) | 3.00E+10 | 9.40E+10 | 1.20E+11 | 1.10E+11 | 9.90E+10 | 1.40E+11 |
| $k_r$ | 0.38 | 0.47 | 0.47 | 0.38 | 0.5 | 0.47 |
| $-d_{31}$ (pm/V) | 61 | 92 | 102 | 63 | 112 | 114 |
| AVERAGE GRAIN DIAMETER (μm) | 1 | 0.9 | 1.7 | 1.7 | 1.5 | 3 |
| MAXIMUM GRAIN DIAMETER (μm) | 3.1 | 2.7 | 6.5 | 9 | 9 | 27 |
| $I_2/I_1$ (%) | 2.8 | 2.7 | 2.9 | 0 | 0 | 0 |

As apparent from Table 2, in all the compositions (comparative example, Experiment Nos. 13 to 15) into which $K_3Nb_3O_6Si_2O_7$ was not introduced, although large grains having a diameter of 9 to 27 μm were distributed in the polycrystalline structure of the ceramic, in all the compositions of Experiment Nos. 10 to 12 each characterized in that $K_3Nb_3O_6Si_2O_7$ was contained, all the polycrystalline structures could be homogenized without considerably degrading the piezoelectric displacement characteristic.

Figure 3:
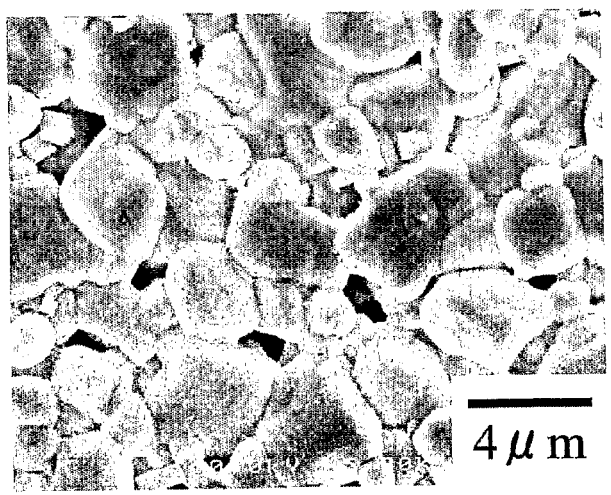
FIG. 3 is a photograph of an observed surface of $0.97[K_{0.5}Na_{0.5}]_{0.96}Li_{0.04}Nb_{0.86}Ta_{0.10}Sb_{0.04}O_3-0.03K_3Nb_3O_6Si_2O_7$ (Experiment No. 12).

As one observation example, a photograph of an observed surface of the disc sample of Experiment No. 12 taken by a SEM is shown in FIG. 3.

By using a ceramic within a range represented by the formula $0.97([K_{1-x}Na_x]_{1-y}Li_y)(Nb_{1-z-w}Ta_zSb_w)O_3 + 0.03K_3Nb_3O_6Si_2O_7$ (where x, y, z, and w satisfy $0 \leq x < 1.0$, $0 \leq y \leq 0.20$, $0 \leq z \leq 0.40$, and $0 \leq w \leq 0.20$, respectively), which is a piezoelectric ceramic having an alkaline-containing niobic acid perovskite structure in Example 2 and which has a composition range different from that in Example 1, electrical properties and piezoelectric properties, such as ϵ, tan δ, ρ, kr, and $-d_{31}$, evaluation of the average grain diameter and the maximum grain diameter by a SEM, $I_2/I_1$ by XRD, and the like were measured as in the measurement performed in Experiment Nos. 1 to 9 and were evaluated, and it was confirmed that as in the case described above, the polycrystalline structure of the above composition could easily be controlled using $K_3Nb_3O_6Si_2O_7$.

As described above, since the internal polycrystalline structure of the piezoelectric ceramic of the present invention is fine and homogeneous, when this piezoelectric ceramic is used for a piezoelectric layer of a piezoelectric device having a conventional laminated structure, that is, is used for a piezoelectric layer of a piezoelectric device in which first electrodes and second electrodes are alternately laminated to each other with piezoelectric ceramic layers interposed therebetween and in which first terminal electrodes electrically connected to the first electrodes and second terminal electrodes electrically connected to the second electrodes are provided, a multilayer formation using many layers can significantly advantageously be performed, the interlayer distance between the layers can be further decreased, and the number of laminations per unit distance can be increased.

The invention claimed is:

1. A piezoelectric ceramic comprising: $[K_{1-x}Na_x]_{1-y}Li_y[Nb_{1-z-w}Ta_zSb_w]O_3$ (x, y, z, and w each indicate a molar ratio, and $0 \leq x < 1$, $0 \leq y < 1$, $0 \leq z < 1$, and $0 \leq w < w$ hold) as a primary phase; and $K_3Nb_3O_6Si_2O_7$ as a subphase.

2. The piezoelectric ceramic according to claim 1, which is expressed as $(1-a)[K_{1-x}Na_x]_{1-y}Li_y[Nb_{1-z-w}Ta_zSb_w]O_3 + aK_3Nb_3O_6Si_2O_7$ (a indicates a molar ratio), wherein $0.003 \leq a < 0.10$ holds.

3. The piezoelectric ceramic according to claim 1, wherein as analyzed by an X-ray diffraction method, a ratio $I_2/I_1$ of a peak intensity $I_2$ of the strongest peak corresponding to a crystalline phase of the $K_3Nb_3O_6Si_2O_7$ to a peak intensity $I_1$ of the strongest peak corresponding to a crystalline phase of the $[K_{1-x}Na_x]_{1-y}Li_y[Nb_{1-z-w}Ta_zSb_w]O_3$ is 0.8% to 9.0%.

4. A piezoelectric device comprising a piezoelectric ceramic layer, via which a first electrode and a second electrode face each other, wherein the piezoelectric ceramic layer is formed of the piezoelectric ceramic according to claim 1.

5. The piezoelectric device according to claim 4, wherein the first electrode and the second electrode are multiply and alternately stacked with the piezoelectric ceramic layer interposed between each electrode, and the piezoelectric device further comprises: first terminal electrodes electrically connected to the first electrodes; and second terminal electrodes electrically connected to the second electrode.

6. The piezoelectric ceramic according to claim 2, wherein as analyzed by an X-ray diffraction method, a ratio $O_2/I_1$ of a peak intensity $I_2$ of the strongest peak corresponding to a crystalline phase of the $K_3Nb_3O_6Si_2O_7$ to a peak intensity $I_1$ of the strongest peak corresponding to a crystalline phase of the $[K_{1-x}Na_x]_{1-y}Li_y[Nb_{1-z-w}Ta_zSb_w]O_3$ is 0.8% to 9.0%.

7. A piezoelectric device comprising a piezoelectric ceramic layer, via which a first electrode and a second electrode face each other, wherein the piezoelectric ceramic layer is formed of the piezoelectric ceramic according to claim 2.

8. The piezoelectric device according to claim 7, wherein the first electrode and the second electrode are multiply and alternately stacked with the piezoelectric ceramic layer interposed between each electrode, and the piezoelectric device further comprises: first terminal electrodes electrically connected to the first electrodes; and second terminal electrodes electrically connected to the second electrode.

9. The piezoelectric ceramic according to claim 1, which is constituted by an alkaline-containing niobic acid-perovskite structure consisting essentially of $[K_{1-x}Na_x]_{1-y}Li_y[Nb_{1-z-w}Ta_zSb_w]O_3$ and $K_3Nb_3O_6Si_2O$.

* * * * *